US007012265B2

(12) United States Patent
Van Der Veen

(10) Patent No.: US 7,012,265 B2
(45) Date of Patent: Mar. 14, 2006

(54) LITHOGRAPHIC APPARATUS, INTEGRATED CIRCUIT DEVICE MANUFACTURING METHOD, AND INTEGRATED CIRCUIT DEVICE MANUFACTURED THEREBY

(75) Inventor: Paul Van Der Veen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 12 days.

(21) Appl. No.: 09/988,387

(22) Filed: Nov. 19, 2001

(65) Prior Publication Data

US 2002/0060296 A1 May 23, 2002

(30) Foreign Application Priority Data

Nov. 23, 2000 (EP) .................................. 00310409

(51) Int. Cl.
*G03F 7/20* (2006.01)

(52) U.S. Cl. ................................ 250/492.2; 250/492.1

(58) Field of Classification Search ............. 250/492.2

See application file for complete search history.

(56) References Cited

U.S. PATENT DOCUMENTS

| | | | | |
|---|---|---|---|---|
| 5,333,495 | A * | 8/1994 | Yamaguchi et al. | 73/105 |
| 6,160,832 | A * | 12/2000 | Kleinschmidt et al. | 372/57 |
| 6,369,398 | B1 * | 4/2002 | Gelernt | 250/492.2 |
| 6,490,025 | B1 * | 12/2002 | Makinouchi et al. | 355/53 |
| 6,586,757 | B1 * | 7/2003 | Melnychuk et al. | 250/504 R |
| 2002/0020220 | A1 * | 2/2002 | Suzuki | 73/579 |
| 2002/0105994 | A1 * | 8/2002 | Partio, et al. | 372/57 |

FOREIGN PATENT DOCUMENTS

| | | | |
|---|---|---|---|
| EP | 0 766 144 | A | 4/1997 |
| JP | 11 260688 | A | 9/1999 |
| WO | 99/39414 | A | 8/1999 |

* cited by examiner

*Primary Examiner*—John R. Lee
*Assistant Examiner*—Phillip A. Johnston
(74) *Attorney, Agent, or Firm*—Pillsbury Winthrop Shaw Pittman, LLP

(57) ABSTRACT

A microphone or other acoustic sensor is used to detect sound or other vibrations caused by the passage of pulses of radiation of a projection beam. The measured vibrations may be used to determine the intensity of the projection beam or the presence of contaminants. The vibrations are caused by absorption of the beam pulses in an absorptive gas or by objects, e.g. the substrate or mirrors in the projection lens, on which the projection beam is incident.

13 Claims, 3 Drawing Sheets

LITHOGRAPHIC APPARATUS, INTEGRATED CIRCUIT DEVICE MANUFACTURING METHOD, AND INTEGRATED CIRCUIT DEVICE MANUFACTURED THEREBY

BACKGROUND OF THE INVENTION

1. Field of the Invention

The present invention relates generally to lithographic projection apparatus and more particularly to lithographic projection apparatus including an acoustic sensor.

2. Description of the Related Art

This application claims priority from European Patent Application EP 00310409.8, herein incorporated by reference.

A typical lithographic projection apparatus includes a radiation system for supplying a projection beam of radiation, a support structure for supporting patterning structure, the patterning structure serving to pattern the projection beam according to a desired pattern, a substrate table for holding a substrate, and a projection system for projecting the patterned projection beam onto a target portion of the substrate.

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally $<1$), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of integrated circuit devices will be present on the substrate (wafer). These integrated circuit devices are then separated from one another by a technique such as dicing or sawing, whence the individual integrated circuit devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Unless otherwise specified, the term "projection beam" in the present specification and claims encompasses both a patterned projection beam downstream of the patterning structure and a non-patterned projection beam (either in the absence of a pattern or in the absence of patterning structure) either upstream or downstream of the location of the patterning structure.

In a lithographic projection process it is important to control accurately the dose (i.e. amount of energy per unit area integrated over the duration of the exposure) delivered to the resist. Known resists are designed to have a relatively sharp threshold whereby the resist is exposed if it receives a dose above the threshold but remains unexposed if the dose is less than the threshold. This is used to produce sharp edges in the features in the developed resist even when diffraction effects cause a gradual tail-off in intensity of the projected images at feature edges. If the projection beam intensity is too incorrect, the exposure intensity profile will cross the resist threshold at the wrong point. Dose control is thus crucial to correct imaging.

In a known lithographic apparatus, dose control is done by monitoring the projection beam intensity at a point in the radiation system and calibrating the absorption of radiation of the projection beam that occurs between that point and substrate level. Monitoring the projection beam intensity is performed using a partially transmissive mirror in the radiation system to divert a known fraction of the projection beam energy to an energy sensor. The energy sensor measures the radiation energy in the known fraction of the projection beam and so enables the projection beam energy at a given point in the radiation system to be determined. The calibration of said absorption of radiation is done by replacing the substrate by a supplementary energy sensor for a series of calibration runs. The output of the former energy sensor effectively measures variations in the output of the radiation source and is combined with the calibration results of said absorption to predict the energy level at substrate level. In some cases the prediction of the energy level at substrate level may take account of, for example, settings of components for shaping a cross section of the projection beam of radiation. Parameters affecting the dose, e.g. duration of the exposure or scanning speed, and/or the output of the radiation source can then be adjusted to deliver the desired dose to the resist.

While the known method of dose control takes account of variations in the output of the radiation source and deals well with predictable variations in absorption of radiation occurring downstream of said partially transmissive mirror, not all variations in absorption are easily or accurately predictable. This is particularly the case for apparatus using exposure radiation of wavelengths such as 157 nm, 126 nm or EUV (less than 50 nm, e.g. 13.6 nm), where the use of a shorter wavelength is essential to reduce the size of the smallest features that can be imaged. Such wavelengths are heavily absorbed by air and many other gases, so that lithographic apparatus making use of them must be either flushed with non-absorbing gases or evacuated. Any variations in the composition of the flushing gas, or leaks from the outside, can result in significant and unpredictable variations in the absorption of the projection beam radiation occurring downstream of the energy sensor in the radiation system and hence of the dose delivered to the resist.

SUMMARY OF THE INVENTION

One aspect of the present invention provides dose sensing and control systems which are able to avoid or alleviate the problems of known energy sensors and dose control systems.

This and other aspects are achieved according to the invention in a lithographic apparatus including an acoustic sensor constructed and arranged to detect sounds caused by the passage of pulses of radiation of the projection beam.

According to a further aspect of the invention there is provided an integrated circuit device manufacturing method including projecting a patterned projection beam of radiation onto a target portion of a layer of radiation-sensitive material on a substrate, detecting one of: sounds caused by the passage of pulses of radiation of said projection beam; vibrations in an object on which said projection beam is incident, and sounds emitted by an object on which said projection beam is incident.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The term "integrated circuit device" as used in the claims is intended to encompass all such devices. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation", and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

The present invention will be described below with reference to exemplary embodiments and the accompanying schematic drawings, in which.

In the Figures, corresponding reference symbols indicate corresponding parts.

DETAILED DESCRIPTION OF EMBODIMENTS OF THE INVENTION

The acoustic sensor, which may be, for example, a microphone, a (micro-)barograph or a vibration sensor, detects sounds caused by the passage of pulses of radiation of the projection beam. These sounds are an effect of localized heating caused when energy from a pulse of radiation is absorbed in the atmosphere through which said pulse of radiation passes, or by an object on which said pulse of radiation is incident, e.g. an optical element in the projection lens or the substrate itself. An output signal of said acoustic sensor can be provided to a controller responsive to said output signal, whereby said controller is constructed and arranged to control the radiation energy per unit area delivered by said projection beam to said substrate during an exposure of a target portion. For example, the amplitude of sound waves detected can be used to detect changes in the intensity of the projection beam or the presence of contaminants, and can thus be used to improve dose control.

The invention may find especially effective use in detecting vibrations caused by the arrival of pulses of radiation at the substrate or their passage through a chamber between the substrate and the element of the projection lens closest to the substrate. In this case, the invention provides a direct and in situ measurement of the projection beam intensity and/or changes of said projection beam intensity at substrate level, allowing for particularly accurate dose control.

Embodiment 1

Figure 1:
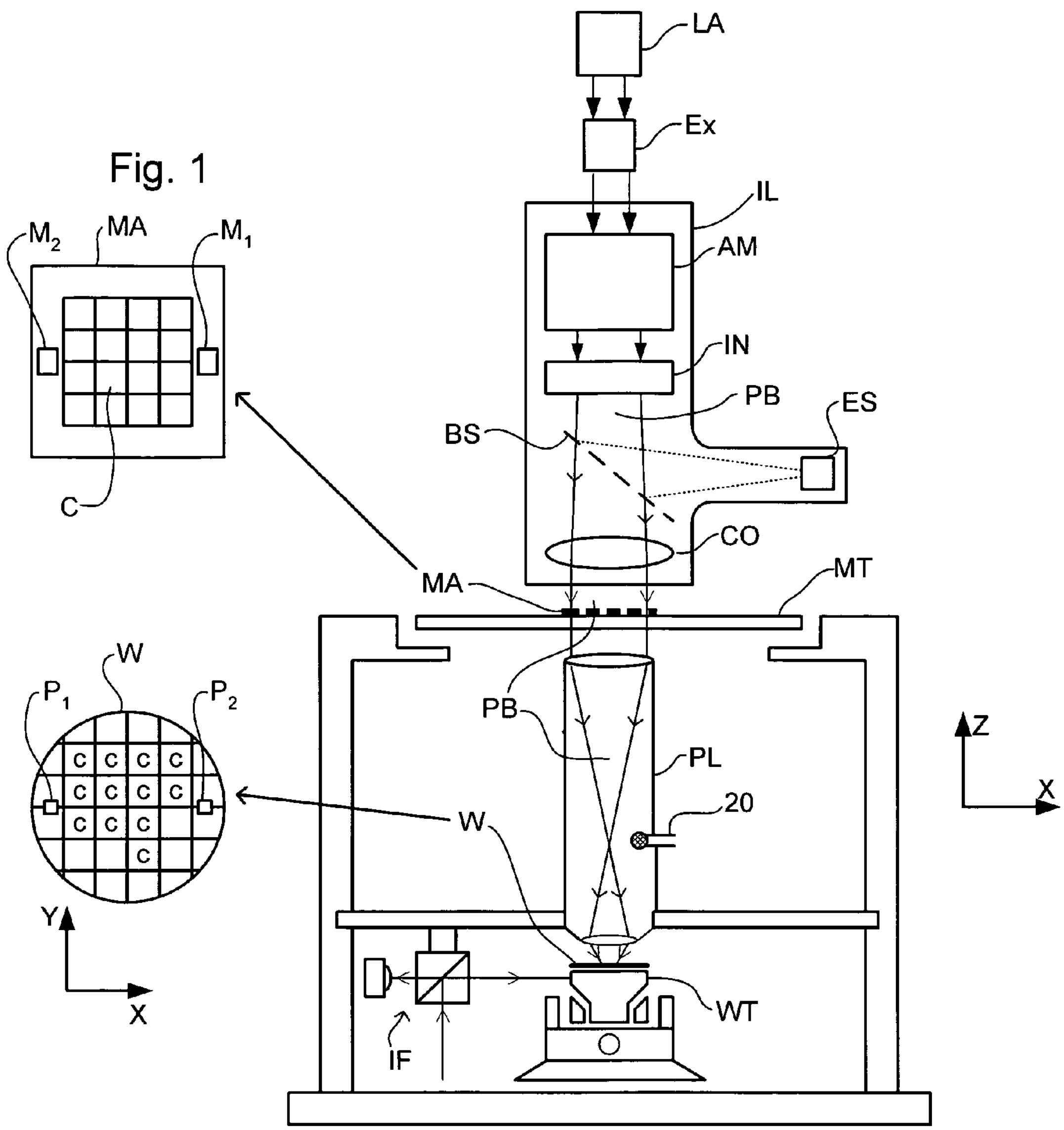
FIG. 1 depicts a lithographic projection apparatus according to a first embodiment of the invention.

FIG. 1 schematically depicts a lithographic projection apparatus according to a particular embodiment of the invention. The apparatus comprises:

- a radiation system Ex, IL, for supplying a projection beam PB of pulsed radiation (e.g. UV radiation such as for example generated by an excimer laser operating at a wavelength of 193 nm or 157 nm, or by a laser-fired plasma source operating at 13.6 nm). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a quartz and/or $CaF_2$ lens system or a catadioptric system comprising lens elements made from such materials, or a mirror system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a UV excimer laser, a laser-fired plasma source, a discharge source, or an undulator or wiggler provided around the path of an electron beam in a storage ring or synchrotron) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the projection beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios. In particular the current invention and claims encompass embodiments wherein the radiation system Ex, IL is adapted to supply a projection beam of radiation having a wavelength of less than about 170 nm, such as with wavelengths of 157, 126 and 13.6 nm, for example.

The projection beam PB subsequently intercepts the mask MA, which is held on a mask table MT. Having traversed the mask MA, the projection beam PB passes through the lens PL, which focuses the projection beam PB onto a target portion C of the substrate W. With the aid of the second positioning means (and interferometric measuring means IF), the substrate table WT can be moved accurately, e.g. so as to position different target portions C in the path of the projection beam PB. Similarly, the first positioning means can be used to accurately position the mask MA with respect to the path of the projection beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

In the illumination system IL, a part of the projection beam PB is diverted to an energy sensor ES by a beam splitter BS. Beam splitter BS may be a partial reflector formed by depositing aluminum on quartz, and used to fold the projection beam to a convenient orientation. In the present embodiment, the beamsplitter is embodied to reflect a known proportion, e.g. 1%, to the energy sensor ES. The output of the energy sensor ES is used in controlling the dose delivered in an exposure.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the projection beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In FIG. 1 an acoustic sensor 20 is provided in a space comprised by the projection system PL to detect sounds caused by the passage of pulses of radiation of the projection beam PB.

Figure 2:
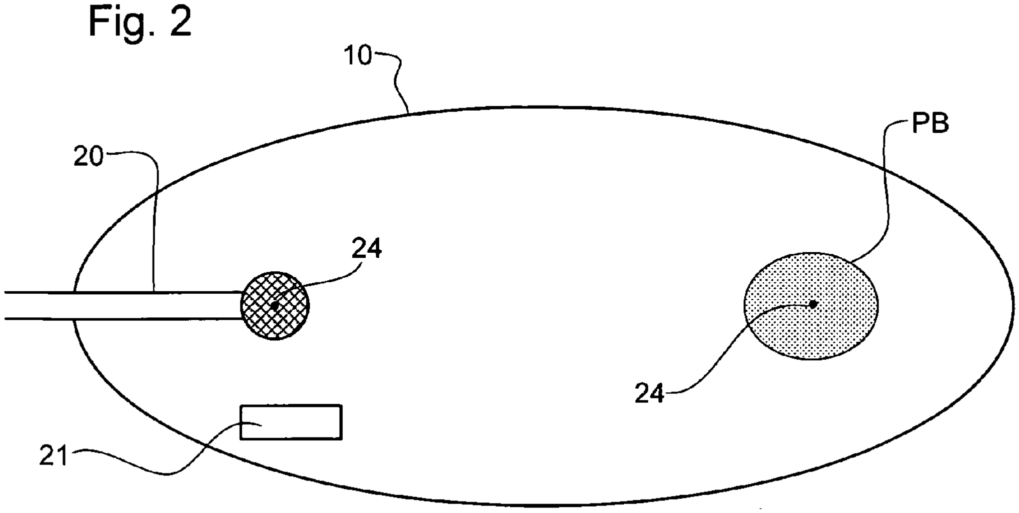
FIG. 2 is a plan view of an acoustic sensor arrangement used in the apparatus of FIG. 1.
Figure 3:
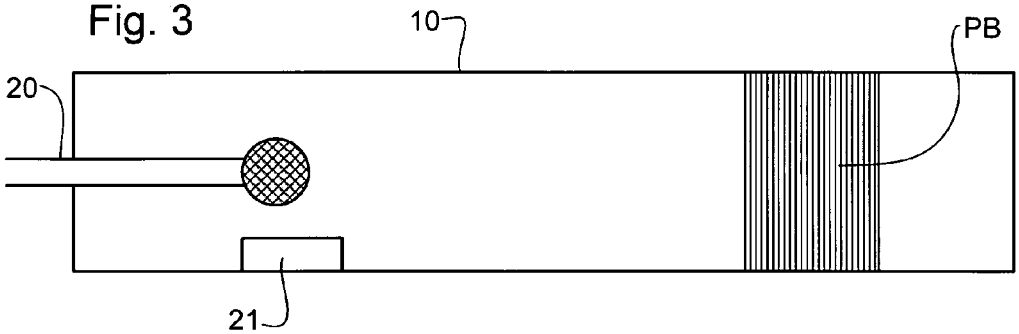
FIG. 3 is a side view of the acoustic sensor arrangement of FIG. 2.

FIGS. 2 and 3 show an arrangement of an acoustic sensor used to measure the intensity of the projection beam PB and/or changes of said projection beam intensity according to the invention. In FIG. 2 a view along the direction of propagation of the projection beam PB in an elliptically shaped chamber 10 is shown. The elliptical shape defines two focal points 24. In FIG. 3 a view of the chamber 10 in a direction perpendicular to the direction of propagation of the projection beam PB is shown. The chamber 10 is substantially transmissive to the radiation of the projection beam PB in a direction parallel to its direction of propagation. The projection beam PB is arranged to traverse one focal point 24 of the elliptical chamber 10, which is filled with a gas of a known composition, while a microphone or micro-barograph 20 is placed at the other focus 24. The composition of the gas in the chamber is selected to have known and predictable absorption properties. Where the projection beam has a wavelength of 157 nm, the gas may, for example, be $N_2$, which is essentially transparent to 157 nm radiation, mixed with a known amount of $O_2$, which strongly absorbs 157 nm radiation. Since almost all gases are strongly absorptive of EUV, any convenient gas can be used in an apparatus using EUV radiation. It should be noted that the absorbing gas may be deliberately introduced for the purpose of the present invention or for some other purpose such as cleaning, or may be an unavoidable residue left behind by the evacuation or purging system, for example.

Because the gas in chamber 10 absorbs radiation from the projection beam, when a projection beam pulse passes through the chamber 10, it will cause localized heating of the gas, leading to a local pressure increase and creating a sound wave. The pressure increase and/or sound wave is then detected by the microphone or micro-barograph 20. Because the chamber is elliptical, any sound wave generated at one focus 24, where the projection beam passes, is focused at the other focus 24 at which the microphone or micro-barograph 20 is located. The size of the pressure change and/or intensity of the sound wave will depend on the intensity of the projection beam pulse and the absorption properties of the gas in chamber 10. Knowledge of these properties, derived theoretically and/or empirically, allows the projection beam pulse intensity to be calculated from the output of the microphone or micro-barograph 20. Calculation of the projection beam intensity may take account of other measurements, e.g. of temperature, made by sensors 21 also provided in chamber 10. The history of previous intensity measurements may also be taken into account.

The acoustic sensor arrangement shown in FIGS. 2 and 3 can be located at any convenient location in the projection beam path between radiation source LA and substrate W. To provide the most accurate measurement of radiation energy delivered to the resist on the substrate W, the acoustic sensor arrangement is preferably located as close to the substrate as possible, e.g. towards the end of the projection system PL.

Figure 4:
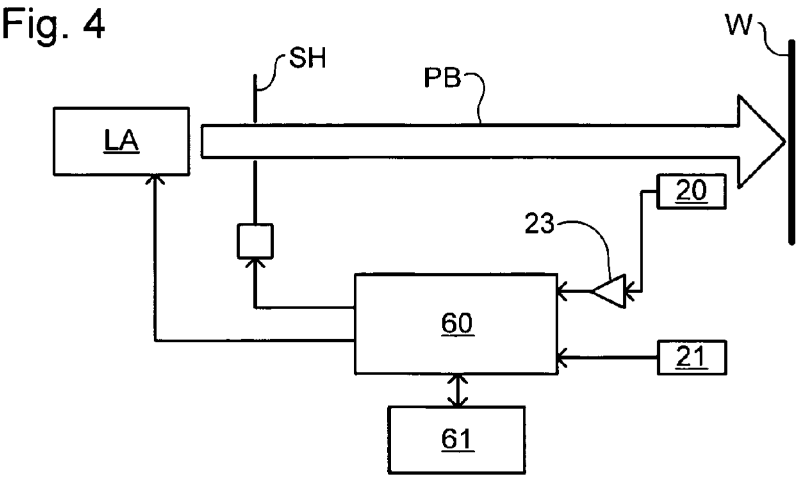
FIG. 4 is a diagram of a control system in the apparatus of FIG. 1.

A dose control system using the above described acoustic sensor arrangement is shown in FIG. 4. This comprises a controller 60 that receives the outputs from microphone or micro-barograph 20, and sensors 21 and use them to calculate the projection beam intensity at substrate level and hence the dose delivered to the resist by each pulse of radiation. An amplifier 23 is used to raise the signal level of the output of the microphone 20 so as to allow the detection of very low intensity sounds. The calculated dose is stored in memory 61, which holds a history of the doses delivered by previous pulses of radiation. Since the exposure of a given target area on the substrate is built up from the doses delivered by a plurality of pulses, the history of previous pulses making up the current exposure is used to determine any necessary correction to be applied to subsequent pulses of radiation contributing to the exposure. The necessary corrections can, for example, be effected, for example, by adjustment of the intensity of the radiation source LA, by adjusting the opening time of a shutter SH, by adjusting the degree of opening of an iris located at an aperture plane of the illumination system, by adjusting the pulse repetition rate, by adjusting the scanning speed in a step-and-scan apparatus, or any suitable combination of these parameters.

Embodiment 2

Figure 5:
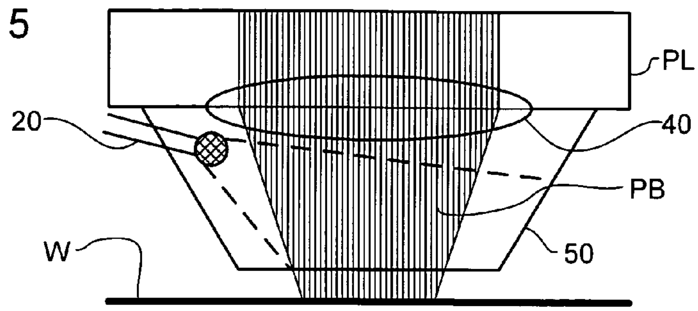
FIG. 5 is side view of part of a lithographic apparatus according to a second embodiment of the invention.

A second embodiment of the present invention, which may be the same as the first embodiment save as described below, is shown in FIG. 5. The microphone (or micro-barograph) 20 is located in a chamber 50 mounted to the projection system PL below the element 40 directly opposite the wafer W; an element such as element 40 may be referred to hereinafter as the "final" element. The chamber 50 occupies most of the space between the final element 40 and substrate W so that the projection beam intensity as determined from the output of the microphone 20 is as close as possible to the actual dose delivered to the resist. The output signal of the microphone 20 can also be used in combination with the output signal of the energy sensor ES to calibrate, for example, changes of absorption of the projection beam along the path of propagation downstream of the beamsplitter BS as shown in FIG. 1.

Embodiment 3

Figure 6:
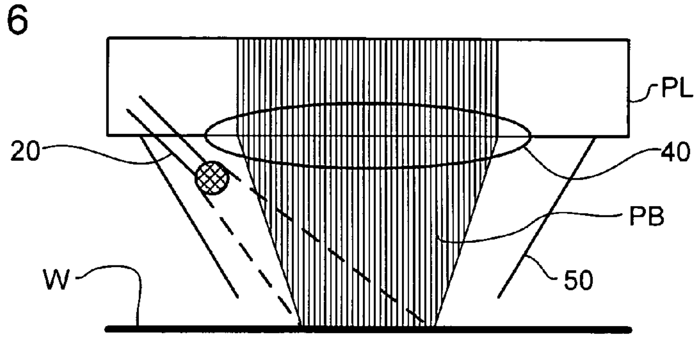
FIG. 6 is a side view of part of a lithographic apparatus according to a third embodiment of the invention.

A third embodiment of the present invention, which may be the same as the first embodiment save as described below, makes use of sound emitted by the substrate when a pulse of radiation of the projection beam is delivered to it. The layout of the acoustic sensor arrangement, shown in FIG. 6, is similar to that of the second embodiment but the microphone 20 is reoriented to pick up sounds emitted by the substrate W. These sounds are caused by the sudden localized heating in the substrate and resist when a pulse of the projection beam PB strikes the substrate W. Local expansion caused by the local heating gives rise to vibrations in the substrate and the emission of sound owing to the large surface area of the substrate. These sounds are picked up by the microphone 20 and their amplitude is indicative of the amount of energy delivered to the substrate in each pulse of radiation.

Embodiment 4

Figure 7:
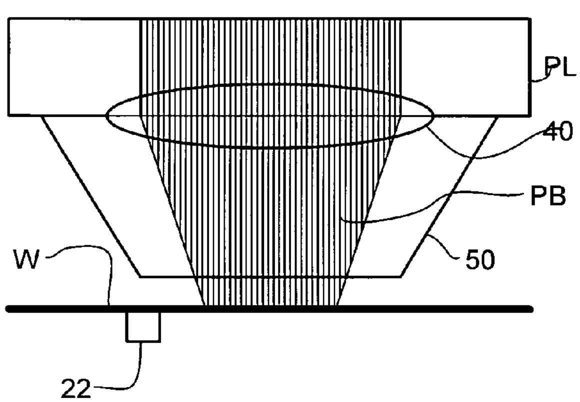
FIG. 7 is a side view of part of a lithographic apparatus according to a fourth embodiment of the invention.

A fourth embodiment of the invention is a variant of the third embodiment but adapted for use when the substrate W is kept in vacuum, e.g. in a lithographic apparatus using EUV radiation. As shown in FIG. 7, the microphone 20 is replaced by a vibration sensor 22 mechanically coupled to the substrate W, e.g. on the rear side. The vibration sensor 22 measures the (acoustic) vibrations in the substrate directly, since there is no medium to carry sound to a microphone.

Embodiment 5

Figure 8:
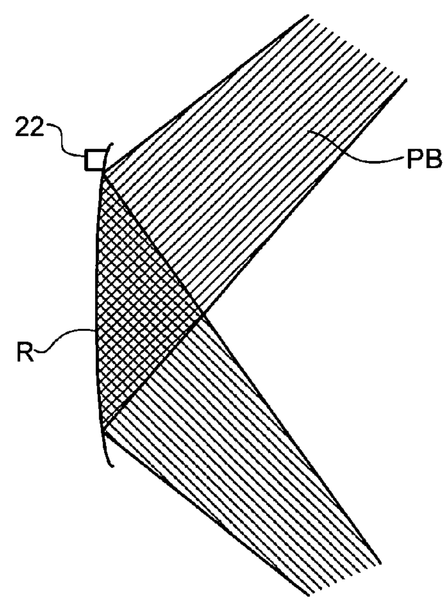
FIG. 8 is a side view of part of a lithographic apparatus according to a fifth embodiment of the invention.

In a fifth embodiment, which is otherwise similar to the fourth embodiment, vibrations in an optical element instead of the substrate are measured. When the projection beam PB traverses an optical element that has less than perfect transmissivity, or is reflected by an optical element, e.g. a mirror in the projection system of a lithographic apparatus using EUV, that has less than perfect reflectivity, a small amount of energy from the projection beam will be absorbed by the element. In the same way as with the substrate W in the previous embodiment, the absorption of this energy will cause localized heating and (acoustic) vibration in the element. The vibration is dependent on the amount of radiation energy absorbed, which will be a fixed or determinable proportion of the projection beam pulse energy, so that measurements of the vibration can be used to determine the projection beam pulse energy and/or the projection beam intensity. In the case of a mirror, the vibrations can conveniently be measured by a vibration sensor 22 mounted on the rear side, as shown in FIG. 8.

Embodiment 6

In the above embodiments, sound caused by the absorption of a known or determinable fraction of radiation energy of the projection beam is measured to determine the intensity of the projection beam. This procedure is based on the premise that the contaminant, or deliberately introduced absorbent, is present in a known quantity and has a known effect. In the sixth embodiment, the converse is used; if the intensity of the projection beam is known or predictable, measurement of the sound caused by the passage of the projection beam can be used to detect or measure the presence of a contaminant that is partially absorbing the projection beam. For example, a leak of air into a purged or evacuated apparatus or the growth of an absorptive layer on an optical element can be detected in this way. Accordingly, in the sixth embodiment, microphones or other pressure or acoustic sensors are positioned in places where contamination may occur, and the sounds detected with the passage of pulses of radiation of the projection beam are monitored to detect any increase in contamination.

It should be noted that the principles of detecting projection beam intensity and detecting contamination may be combined within the same apparatus, either by use of multiple sensors or even using the same sensors. For example, under normal circumstances, the gas in a chamber may absorb 1% of the radiation passing through it and give rise to a baseline sound. However, should a contaminant cause the absorption to rise to 2% this will cause a doubling of the radiation energy absorbed and a very substantial increase in the sound detected. A doubling of the intensity of the projection beam, which would be the other possible cause of such a large increase in the detected sound, is likely to be implausible so that the large sound increase can be attributed to an increase in contaminants rather than a change in the output of the radiation source. Similarly, trends in the detected sounds can be monitored and attributed to changes in the projection beam intensity or contamination by trend-pattern matching.

While specific embodiments of the invention have been described above, it will be appreciated that the invention may be practiced otherwise than as described. The description is not intended to limit the invention.

What is claimed is:

1. A lithographic projection apparatus comprising:

a radiation system to provide a projection beam of radiation;

a support structure adapted to support patterning structure which can be used to pattern the projection beam according to a desired pattern;

a substrate table to hold a substrate;

a projection system to project the patterned beam onto a target portion of the substrate;

an acoustic sensor constructed and arranged to detect sounds caused by the passage of pulses of radiation of the projection beam; and a controller in communication with said acoustic sensor and responsive to an output signal of said acoustic sensor, wherein said controller is configured to calculate a radiation energy per unit area at substrate level and to control said radiation energy per unit area delivered by said projection beam of radiation to said substrate, in response to said output signal of said acoustic sensor.

2. Apparatus according to claim 1 wherein the acoustic sensor comprises a microphone or barograph located in a chamber filled with an atmosphere partially absorbent of said projection beam radiation and traversed by said projection beam during operation of the lithographic projection apparatus.

3. Apparatus according to claim 2 wherein said chamber is located between the substrate table and an element of the projection system directly opposite the substrate table.

4. Apparatus according to claim 1 wherein the acoustic sensor comprises a vibration sensor mechanically coupled to an object on which said projection beam is incident, so as to measure vibrations in that object.

5. Apparatus according to claim 1 wherein the acoustic sensor comprises a microphone constructed and arranged to detect sounds emitted by an object on which the projection beam is incident.

6. Apparatus according to claim 4 wherein the object is the substrate.

7. Apparatus according to claim 4 wherein the object is an element of the projection system.

8. Apparatus according to claim 3 wherein the chamber comprises structure constructed and arranged to focus sound generated by the projection beam onto the acoustic sensor.

9. Apparatus according to claim 8 wherein said sound focusing structure comprises an inner surface of the chamber which is elliptically shaped in at least one cross-section of the chamber.

10. An apparatus according to claim 1, wherein the support structure comprises a mask table for holding a mask.

11. An apparatus according to claim 1, wherein the radiation system comprises a radiation source.

12. An integrated circuit device manufacturing method comprising:

projecting a patterned projection beam of radiation onto a target portion of a layer of radiation-sensitive material on a substrate;

detecting one of:

sounds caused by the passage of pulses of radiation of said projection beam; and sounds emitted by an object on which said projection beam is incident, and in response to the detecting, calculating a radiation energy per unit area at substrate level and controlling the radiation energy per unit area delivered by said projection beam to said substrate during an exposure of a target portion.

13. An integrated circuit device manufactured according to the method of claim 12.

* * * * *

UNITED STATES PATENT AND TRADEMARK OFFICE

CERTIFICATE OF CORRECTION

PATENT NO. : 7,012,265 B2
APPLICATION NO. : 09/988387
DATED : March 14, 2006
INVENTOR(S) : Van Der Veen It is certified that error appears in the above-identified patent and that said Letters Patent is hereby corrected as shown below:

In column 10, line 49, change “claim 3” to --claim 2--.

Signed and Sealed this

Eleventh Day of July, 2006

JON W. DUDAS
*Director of the United States Patent and Trademark Office*